United States Patent
Alhawari et al.

(10) Patent No.: US 9,972,761 B2
(45) Date of Patent: May 15, 2018

(54) AUTO-POLARITY IN AN INDUCTOR BASED CONVERTER

(71) Applicant: Khalifa University of Science, Technology & Research, Abu Dhabi (AE)

(72) Inventors: Mohammad Radwan Alhawari, Abu Dhabi (AE); Baker Mohammad, Abu Dhabi (AE); Hani Hasan Mustafa Saleh, Abu Dhabi (AE); Mohammed Ismail Elnaggar, Abu Dhabi (AE)

(73) Assignee: KHALIFA UNIVERSITY OF SCIENCE AND TECHNOLOGY, Abu Dhabi (AE)

(*) Notice: Subject to any disclaimer, the term of this patent is extended or adjusted under 35 U.S.C. 154(b) by 538 days.

(21) Appl. No.: 14/672,684

(22) Filed: Mar. 30, 2015

(65) Prior Publication Data

US 2016/0284961 A1    Sep. 29, 2016

Related U.S. Application Data

(60) Provisional application No. 62/138,088, filed on Mar. 25, 2015.

(51) Int. Cl.
*H01L 35/28*  (2006.01)
*H02J 7/34*  (2006.01)
*H02J 7/00*  (2006.01)
*H02J 50/00*  (2016.01)

(52) U.S. Cl.
CPC ............ *H01L 35/28* (2013.01); *H02J 7/34* (2013.01); *H02J 50/00* (2016.02); *H02J 2007/0059* (2013.01); *Y10T 307/839* (2015.04)

(58) Field of Classification Search
CPC .............................. H01L 35/28; Y10T 307/839
USPC ............ 310/306; 361/245, 246, 84; 307/127
See application file for complete search history.

(56) References Cited

U.S. PATENT DOCUMENTS

| | | | | |
|---|---|---|---|---|
| 4,473,757 A | * | 9/1984 | Farago | H01L 27/092 307/127 |
| 6,462,929 B2 | * | 10/2002 | Compton | H01L 29/94 361/246 |
| 8,531,226 B2 | * | 9/2013 | Montalbo | H02M 7/219 361/246 |
| 2016/0284961 A1 | * | 9/2016 | Alhawari | H01L 35/28 |

OTHER PUBLICATIONS

Alhawari, et al., "A survey of thermal energy harvesting techniques and interface circuitry," Electronics, Circuits, and Systems (ICECS), 2013 IEEE 20th International Conference on , pp. 381,384 (Dec. 8-11, 2013).

(Continued)

*Primary Examiner* — Fritz M Fleming
(74) *Attorney, Agent, or Firm* — Kilpatrick Townsend & Stockton LLP

(57) ABSTRACT

A thermoelectric energy harvesting system for charging an energy store from ambient thermal energy includes a thermoelectric energy generator (TEG), an automatic polarity monitor, and switching matrix. The polarity monitor detects when the polarity of an input voltage in the system is reversed relative to a standard voltage polarity, and causes the switching matrix to switch the inputs from the thermoelectric energy harvester.

11 Claims, 4 Drawing Sheets

(56) References Cited

OTHER PUBLICATIONS

LTC3109 : Auto-Polarity, Ultralow Voltage Step-Up Converter and Power Manager. [online] Linear Technology, 2010 Retrieved from the Internet: <URL: http://www.linear.com/>, 24 pages.
Lu, et al., "Efficient design of micro-scale energy harvesting systems," IEEE J. Emerg. Sel. Top. Circuits Syst., vol. 1, pp. 254-266 (Sep. 2011).

* cited by examiner

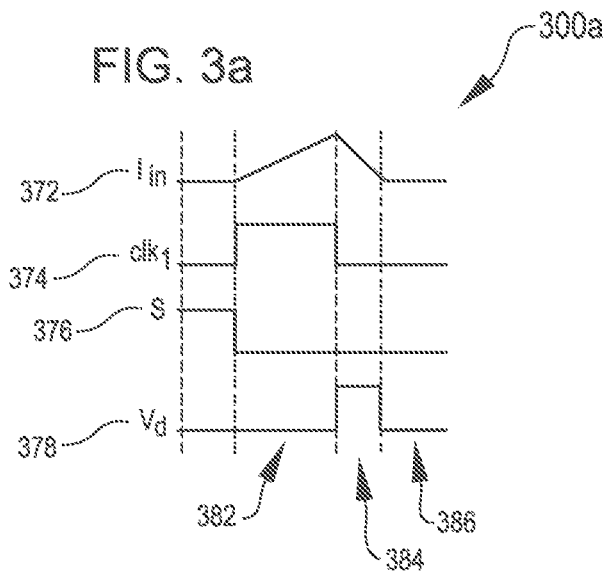
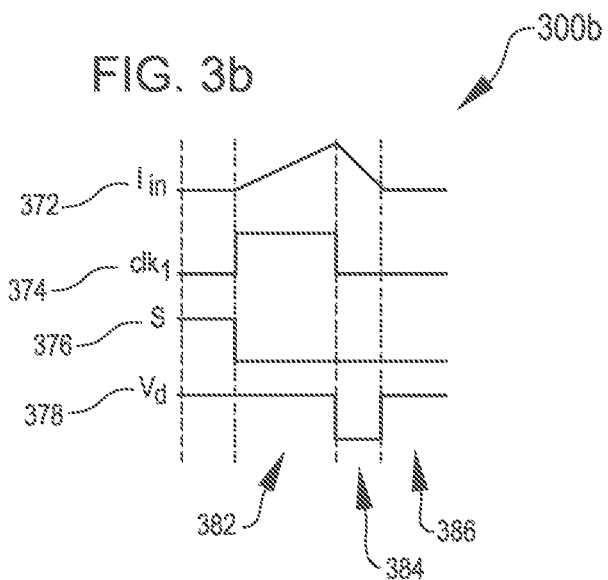

AUTO-POLARITY IN AN INDUCTOR BASED CONVERTER

CROSS-REFERENCE TO RELATED APPLICATION

The present application claims the benefit of U.S. Provisional Application No. 62/138,088, filed on Mar. 25, 2015, the full disclosure of which is incorporated herein by reference.

BACKGROUND

Energy harvesting from ambient sources has become a topic of interest for increasing the lifetime of electronic devices, especially in wireless sensor nodes. In addition, energy harvesting can recharge batteries to prolong the life of electronic devices, in some cases enabling devices to run perpetually without human intervention. Thus, such techniques are useful in hard to reach places such as bridges and in implants such as pacemakers.

Energy can be harvested from many sources such as solar, thermal, vibration and RF. The availability of these sources affect the life time of the electronic device that use them. Further, in some energy source such as thermal, the availability depends on the polarity of the source. As such, detecting the polarity of the energy source is indeed necessary for perpetual operation of the electronic devices. For example, thermal energy harvesting is conventionally done by converting thermal energy into electrical energy using a thermoelectric generator (TEG). When a temperature difference exists across a TEG, an electron-hole pair moves inside the TEG thereby producing a current flow. This phenomenon is called the Seebeck effect. The amount of output voltage is related to the temperature difference across the TEG. The polarity of the output voltage depends on the orientation of the TEG relative to the hot and cold temperature reservoirs.

BRIEF SUMMARY

The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented later.

Embodiments herein disclosed relate to, for example, apparatus and methods having automatic polarity monitoring and switching. In embodiments, a polarity monitoring module may be connected with a storage module within a thermoelectric energy harvesting system, such that the polarity of the voltage produced by a TEG is detected. A node at which the polarity monitoring module detects polarity can be positioned downstream of an amplifier in the storage module, so that the polarity of an amplified voltage is detected. The polarity detection module can be connected to a switching matrix, such that when the polarity is reversed relative to an initial polarity, the polarity detection module causes the switching matrix to reverse the positive and negative outputs of the TEG relative to the energy harvesting system, thus enabling the system to continue to collect energy. In various embodiments, a polarity monitoring module and switching matrix may be applied to a variety of energy sources or signal sources, which may or may not include energy storage or voltage amplification.

For a fuller understanding of the nature and advantages of the present invention, reference should be made to the ensuing detailed description and accompanying drawings.

BRIEF DESCRIPTION OF THE DRAWINGS

Various embodiments in accordance with the present disclosure will be described with reference to the drawings, in which:

FIG. 3a is a signal timing chart for the evaluation cycle of the thermoelectric harvesting system illustrated in FIG. 2 when the system is operating with a standard polarity;

FIG. 3b is a signal timing chart for the evaluation cycle of the thermoelectric harvesting system illustrated in FIG. 2 when the system is operating with reversed polarity.

FIG. 4b is a signal timing chart for operation of the thermoelectric harvesting system shown in FIG. 4a.

DETAILED DESCRIPTION

In the following description, various embodiments of the present invention will be described. For purposes of explanation, specific configurations and details are set forth in order to provide a thorough understanding of the embodiments. However, it will also be apparent to one skilled in the art that the present invention may be practiced without the specific details. Furthermore, well-known features may be omitted or simplified in order not to obscure the embodiment being described.

Various embodiments herein described are directed to apparatus and methods having automatic polarity monitoring and switching. A polarity monitor and switch matrix may be applied to a variety of circuits where the voltage polarity of an energy or signal source is relevant to the operation of the circuit. Automatic polarity monitoring and switching may be useful for any application where a particular voltage polarity is important for the operation of a device, but where the polarity of an input voltage to the device may be variable, or may be dependent on human intervention. For example, where a voltage of the incorrect polarity may damage an electronic component, an automatic polarity monitor and switch matrix may be incorporated into, or attached to, the electronic component to detect and correct a reversed input polarity. By way of further example, where a device such as a sensor is configured to output a signal or human-readable indication based on an input signal, and the output or indication is dependent on a correct polarity of the input signal, an automatic polarity monitor and switch matrix may be used to ensure that an input signal is always correct. In various embodiments, the energy source may be a source other than a TEG; for example: a signal generator, a sensor, a conventional power supply, or any other suitable energy source. These features can be used for a variety of different energy sources, but in embodiments described herein are discussed with reference to thermoelectric energy harvesting systems.

Some embodiments are directed to thermoelectric energy harvesting systems including a TEG, a storage module, an energy store, a polarity monitor, and a switching matrix. The TEG generates a voltage when thermally connected between two temperature reservoirs at different temperatures. The polarity of the voltage generated by the TEG depends on the orientation of the hot and cold temperature reservoirs relative to the TEG. The polarity monitor detects when the polarity of a voltage generated by the TEG is reversed relative to a standard operating polarity and causes the switch matrix to switch the order of connections between the TEG and downstream components of the thermoelectric energy harvesting system.

Figure 1:
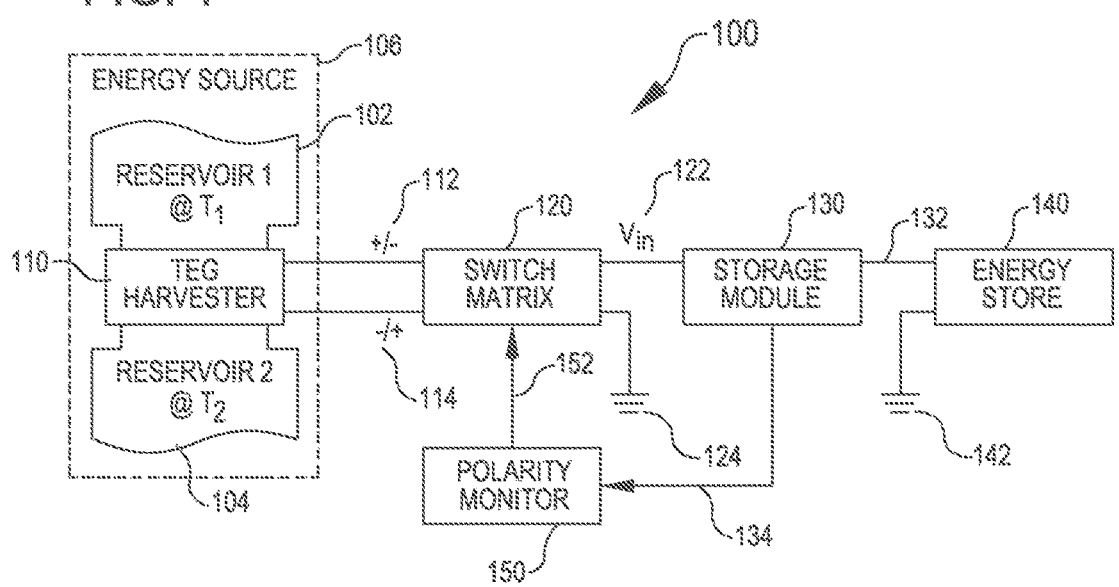
FIG. 1 is a block diagram illustrating a thermoelectric energy harvesting system having automatic polarity monitoring and switching, in accordance with embodiments.

Referring now to the drawings, in which like reference numerals represent like parts throughout the several views, FIG. 1 shows a block diagram of an illustrative thermoelectric harvesting system 100, in accordance with embodiments. The system 100 has two temperature reservoirs 102, 104 in thermal communication with a TEG 110, forming an energy source 106. The TEG has electrical first and second connections 112 and 114, with a voltage difference between them caused by the TEG, connected to a switch matrix 120. The switch matrix 120 is connected to a storage module 130 at a $V_{In}$ node 122 and to a ground 124. The TEG 110 is oriented relative to the first and second temperature reservoirs 102, 104 such that, under standard operating conditions, the first TEG connection 112 has a positive voltage relative to the second connection 114. When the voltage polarity across the TEG 110 is positive, the switch matrix connects the first connection 112 with the VIn node 122 and connects the second connection 114 with ground 124.

The storage module 130 may be any suitable module for converting a variable voltage into a form suitable for charging a capacitor or battery, or for operating an electrical device. In the illustrated system 100, the storage module 130 is a circuit for storing electrical energy generated by the TEG in an energy store 140, in accordance with embodiments. The storage module 130 operates by receiving a voltage at the VIn node 122 as an input voltage and outputting an appropriately amplified voltage and current to the energy store 140 to charge a battery or capacitor, or to operate an electrical device, at the energy store. In some embodiments, the storage module 130 is a clocked DC-DC boost converter.

A polarity monitor 150 is operationally connected with the switch matrix 120. The polarity monitor 150 can be any suitable device for detecting the polarity of a voltage, for example a voltage at the VIn node 122, or of a voltage of any other suitable node in the storage module 130 that would necessarily have the same polarity as VIn node. For example, in embodiments, the polarity monitor 150 has a connection 134 to the storage module 130, such that it can detect the polarity of a voltage amplified by the storage module 130. By detecting the polarity of an amplified voltage, the polarity monitor 150 can be effective even when the voltage at the VIn node is of low magnitude.

The polarity monitor 150 is connected with the switch matrix 120 via a connection 152, so that, when a reversed polarity is detected by the polarity monitor 150, the switch matrix can reverse the first and second connections 112, 114 of the TEG 110, thus reversing the polarity of the voltage at the VIn node 122. The polarity monitor 150 is operable to continue to monitor the polarity, and can cause the switch matrix 120 to revert the first and second connections 112, 114 whenever the polarity of the TEG 110 returns to the standard polarity.

Figure 2:
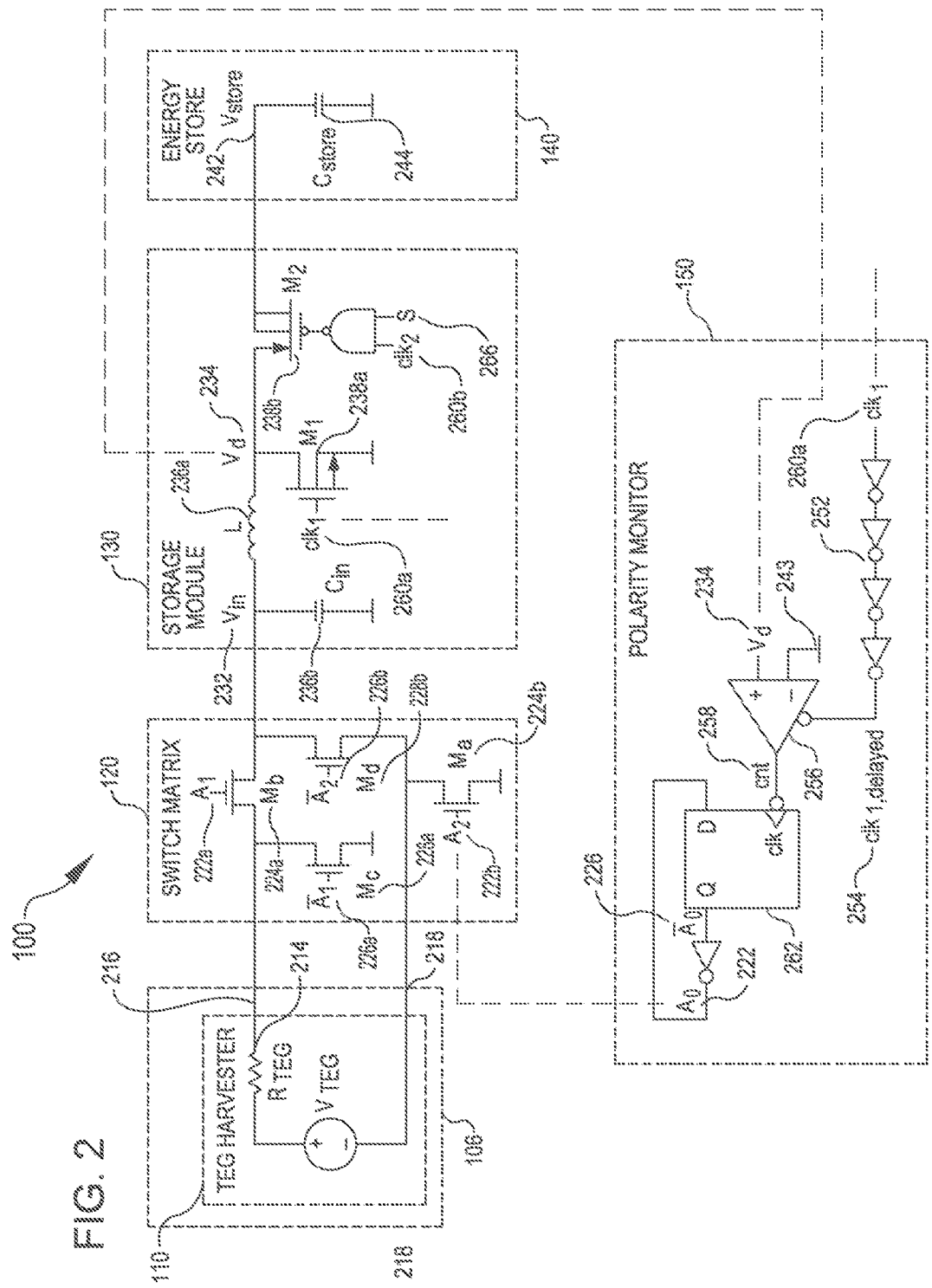
FIG. 2 is an exemplary simplified circuit diagram showing an embodiment of a thermoelectric harvesting system, in accordance with embodiments.

FIG. 2 shows a simplified circuit diagram illustrating an embodiment of the thermoelectric harvesting system 100 of FIG. 1. In the illustrated embodiment, the thermoelectric harvesting system 100 includes a TEG 110 that produces a voltage difference $V_{TEG}$, and a resistor 214 with resistance $R_{TEG}$. The voltage $V_{TEG}$ across the TEG 110 can be nominally positive under standard operating conditions. The positive and negative leads 216 and 218 of the TEG 110 connect with the switch matrix 120.

In the illustrated embodiment, the switch matrix 120 includes four switches, in pairs $M_b$ 224a, $M_a$ 224b, and $M_c$ 228a, $M_d$ 228b, that are controlled via control signal A at input nodes $A_1$ 222a, $A_2$ 222b and control signal $\overline{A}$ at $\overline{A}_1$ 226a, $\overline{A}_2$ 226b, respectively. When the control signal A at nodes $A_1$, $A_2$ 222a, 222b is high, the control signal $\overline{A}$ at nodes $\overline{A}_1$, $\overline{A}_2$ 226a, 226b is low, and vice versa. When the control signal A is high, switches $M_b$ 224a and $M_a$ 224b are closed (thereby conducting) and switches $M_c$ and $M_d$ 228a, 228b are open (non-conducting). When the control signal A is high, the nominally positive lead 216 from the TEG 110 is connected to the storage module 130 at the $V_{In}$ node 232, and the nominally negative lead 218 of the TEG 110 is connected to ground. Conversely, when the control signal A is low (and the control signal $\overline{A}$ is high), the switches $M_c$ 228a and $M_d$ 228b are closed and the switches $M_b$ 224a and $M_a$ 224b are open, such that the nominally negative lead 218 connects to the storage module 130 and the nominally positive lead 216 connects to ground. When the control signal A is high, the polarity of voltage $V_{TEG}$ output by the TEG 110 is positive. When the control signal $\overline{A}$ is high, the polarity of $V_{TEG}$ output by the TEG 110 is negative.

The storage module 130 in the illustrated embodiment is a DC-DC boost converter having an input voltage $V_{In}$ at the $V_{In}$ node 232 and an output voltage $V_d$ at a $V_d$ node 234. The output voltage at the $V_d$ node 234 is amplified from the input voltage $V_{In}$ at the $V_{In}$ node 232 by means of a clocked capacitor-inductor system including an inductor 236a, a capacitor 236b, a first switch $M_1$ 238a controlled by a first clock signal $CLK_1$ at a first clock node $CLK_1$ 260a, and second switch $M_2$ 238b controlled by a second clock signal $CLK_2$ at a second clock node $CLK_2$ 260b.

When the polarity of the voltage $V_{In}$ at the $V_{In}$ node 232 is positive, the storage module 130 operates as follows: In a first cycle subset, the timed capacitor-inductor system builds current in the inductor 236a by charging the capacitor 236b while the first switch $M_1$ 238a is closed and the second switch $M_2$ 238b is open. During this current-building cycle subset, voltage $V_d$ at the $V_d$ node 234 is low.

In a second cycle subset, the first switch $M_1$ 238a is open and the second switch $M_2$ 238b is closed, causing voltage $V_d$ at the $V_d$ node 234 to go high due to transient forcing from the inductor 236a. While switch 238a is open and switch 238b is closed, voltage $V_{store}$ at a $V_{store}$ node 242 rises toward voltage $V_d$ at the $V_d$ node 234 while energy is integrated into the storage element 244 in the energy store 140.

In a third cycle subset, both switches are open thereby allowing the capacitor 236b to resume charging. While switch $M_2$ 238b is open, $V_{store}$ 242 decreases as energy is integrated into a storage element 244 in the energy store 140. The first switch $M_1$ 238a is subsequently closed, allowing the cycle to repeat.

The polarity monitor module 150 in the illustrated embodiment is configured to monitor the polarity of the voltage $V_d$ at the $V_d$ node 234 by using a clocked comparator 256. The polarity monitor module 150 receives as input signals the voltage $V_d$ at the $V_d$ node 234 and a delayed clock signal $CLK_{1D}$ at a $CLK_{1D}$ node 254 (delayed by a delay circuit 252), and outputs a signal CNT at a CNT node 258.

The delay circuit 252 is configured to trigger the comparator at a suitable time such that the voltage at the $V_d$ node 234 will be monitored while amplified, rather than while null or in transition. The comparator 256 receives as inputs the voltage at the $V_d$ node 234 and a null node 243, which may be ground so that, if $V_d$ is positive, the comparator will generate a positive signal at the CNT node 258; and if $V_d$ is negative, the comparator will return the null signal. In alternative embodiments, the null node 243 may be connected to the $V_{store}$ node.

A control circuit 262 in the polarity monitor module 150 stores information concerning the polarity of voltage $V_d$ at the $V_d$ node 234 based on the input of the signal CNT at the CNT node 258. When $V_d$ 234 is positive, the signal CNT at the CNT node 258 is "1", causing the control circuit to remain static such that the emitted control circuit signals $\overline{A}$ and A at control output nodes $\overline{A}_0$ 226 and $A_0$ 222 remain the same. The control output nodes $A_0$ 222 in the polarity monitor module is connected with control input nodes $A_1$ 222a, $A_2$ 222b in the switch matrix 120. The control output node $\overline{A}_0$ 226 is connected with control input nodes $\overline{A}_1$ 226a, $\overline{A}_2$ 226b.

When voltage $V_d$ at the $V_d$ node 234 is negative, signal CNT at the CNT node 258 is null, causing the emitted control signal $\overline{A}$ at the control output node $\overline{A}_0$ 226 to change (e.g. from 0 to 1, or from 1 to 0). When the signal value changes, the switch matrix 120 will cause the open and closed gates to reverse states. In turn, the polarity of $V_{In}$ at the $V_{In}$ node 232 and, concomitantly, the polarity of voltage $V_d$ at the $V_d$ node 234, will reverse. In a subsequent cycle, $V_d$ 234 will once again be positive, and the control circuit 262 will retain the new values of $\overline{A}$ and A at the $\overline{A}_0$ and $A_0$ nodes 226,222 until the polarity monitor 150 detects a new change in polarity.

The polarity monitor module 150 generally does not measure a polarity at each cycle of the clock $CLK_1$ 260a, but rather according to periodic evaluation cycles. In embodiments, an evaluation cycle clock (not shown) is configured to connect with the storage module at, for example, the storage module monitoring control node S 266 and at polarity monitor control circuit 262 for triggering an evaluation cycle. In such embodiments, a control signal S at the control node S 266 is configured to activate at regular evaluation periods, masking the signal of clock $CLK_2$ 260b, such that the switch $M_2$ remains open causing voltage $V_d$ to be detected at the polarity monitor 250 without impacting or receiving interference from voltage $V_{Store}$ at the $V_{Store}$ node 242.

In alternative embodiments, the evaluation cycle may be triggered in response to signals other than a clock. For example, a sensor associated with the thermal energy harvesting system 100 may be configured to trigger an evaluation cycle when any suitable environmental criterion is met; in response to a manual trigger; in response to an alarm from an associated device, such as a low-battery alarm; or any other suitable criterion. In embodiments having a monitoring cycle regulated by a clock, the evaluation cycle may be triggered at intervals that are long relative to the clock cycle of the first clock $CLK_1$ 234. For example, an evaluation cycle may be performed on the order of minutes or longer, depending on the rate of change of temperatures expected in the environment.

In embodiments, any or all of the components included in the switch matrix and polarity monitor can be digital, and may be integrated on a chip. By including digital components rather than analog components, the thermoelectric energy harvesting system can be significantly less bulky than with analog components, and can therefore be incorporated into small medical devices such as implants. Also, by measuring the polarity of an amplified voltage, the polarity monitor can be effective even when the magnitude of an input voltage is very small, which may occur when the available temperature difference is small. Thus, various embodiments may be suitable for use in applications requiring small size and having small available temperature differences, or where the hot and cold reservoirs may periodically switch, such as: in medical implants; wearable applications, such as at a skin/air interface; solar-thermal applications such as at a juncture between indoor and outdoor regions; and other suitable applications.

FIG. 3a shows a control signal timing chart 300a for and operational mode of the thermoelectric harvesting system 100 shown in FIGS. 1 and 2, in which the polarity of the voltage generated by the TEG 110 is positive. Current $I_{In}$ 372 relates to a current through the inductor 236a in FIG. 2; Clock signal CLK1 374 relates to the clock node 260a in FIG. 2; monitoring control signal S 376 relates to monitoring control signal node S 266 in FIG. 2; and the voltage $V_d$ 378 relates to a voltage at the $V_d$ node 234 in FIG. 2.

During a first subset 382 of a clock cycle, the clock signal $CLK_1$ 374 switches on while the monitoring control signal 376 is drawn low such that the current $I_{In}$ 372 ramps linearly and $V_d$ 378 remains at ground. The monitoring control signal 376 masks the second clock signal at the second clock node $CLK_2$ 260b (FIG. 2), such that the second switch $M_2$ 238b (FIG. 2) remains open regardless of the second clock cycle, during the evaluation cycle. Thus, control signal 372 prevents the voltage $V_{store}$ from the energy store 140 from interfering with, or being impacted by, the voltage $V_d$ 378 at the $V_d$ node 234 (FIG. 2).

During a second cycle subset 384, when the clock $CLK_1$ 374 switches off, the voltage $V_d$ 378 increases for as long as the current 472 is falling toward equilibrium. During a third cycle subset 386, after the current has fallen to equilibrium, the cycle rests. The voltage $V_d$ 378 is positive at the second subset 484, and can be measured by a polarity monitor during this subset of the clock cycle.

FIG. 3b shows a control signal timing chart 300b for the operational mode of the thermoelectric harvesting system 100 in which the polarity of the voltage generated by the TEG 110 is negative. As in FIG. 3a above, the evaluation cycle initiates at a first cycle subset 382 when clock signal $CLK_1$ 374 switches on and monitoring control signal S 376 goes low, causing the second switch M2 260b (FIG. 2) to remain open. During the first subset 382 of the clock cycle, the magnitude of current $I_{In}$ 372 in the inductor 236a (FIG. 2) increases, but the flow of current is in the opposite direction compared to the current flow in FIG. 3a. During a second subset 384 of the clock cycle, the clock signal $CLK_1$ 374 goes low, causing the voltage $V_d$ 378 to become negative due to the negative polarity of the current in the inductor 236a. The voltage $V_d$ 378 can be measured by a polarity monitor at this subset of a cycle. Because the monitoring control signal S 376 has caused the second switch M2 260b (FIG. 2) to remain open, the negative voltage polarity of voltage $V_d$ at the $V_d$ node 234 (FIG. 2) does not impact the energy stored in the energy store.

Figure 4A:
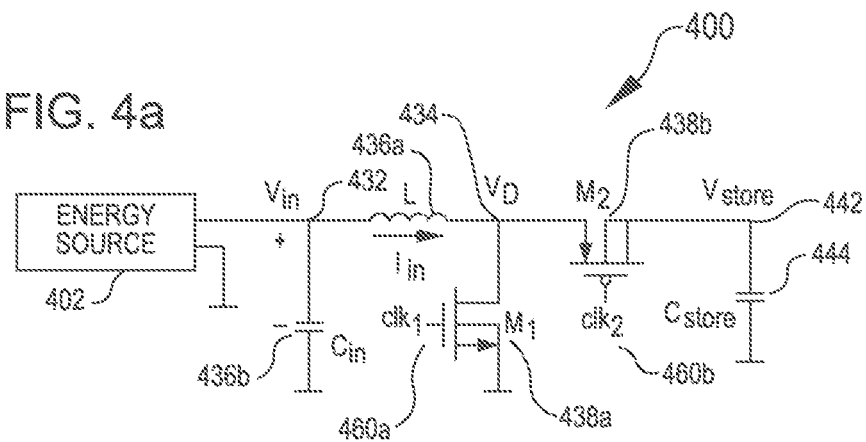
FIG. 4a is a simplified circuit diagram showing a conventional thermoelectric harvesting system without polarity switching.

For purposes of contrast, FIG. 4a shows a simplified circuit diagram of a conventional thermoelectric energy harvesting system 400. In the conventional system 400, the energy source 402 generates a voltage $V_{In}$ at a $V_{In}$ node 432, which causes a current to flow through an inductor 436a while a charge builds in a capacitor 436b.

When the voltage $V_{In}$ at the $V_{In}$ node 432 is positive, the conventional circuit 400 operates similarly to the embodiment of the thermoelectric energy harvesting system 100 shown in FIG. 2. Clocks signal nodes $CLK_1$ 460a and $CLK_2$ 460b alternatingly open and close switches M1 and M2 in a sequence (see FIG. 4b) so as to linearly ramp the current in the inductor 436a to amplify a voltage $V_d$ at a $V_d$ node 434 relative to the input voltage $V_{In}$ at the $V_{In}$ node 432; and then to periodically transfer the energy generated by the energy source 402 into an energy storage element $C_{store}$ 444.

Figure 4B:
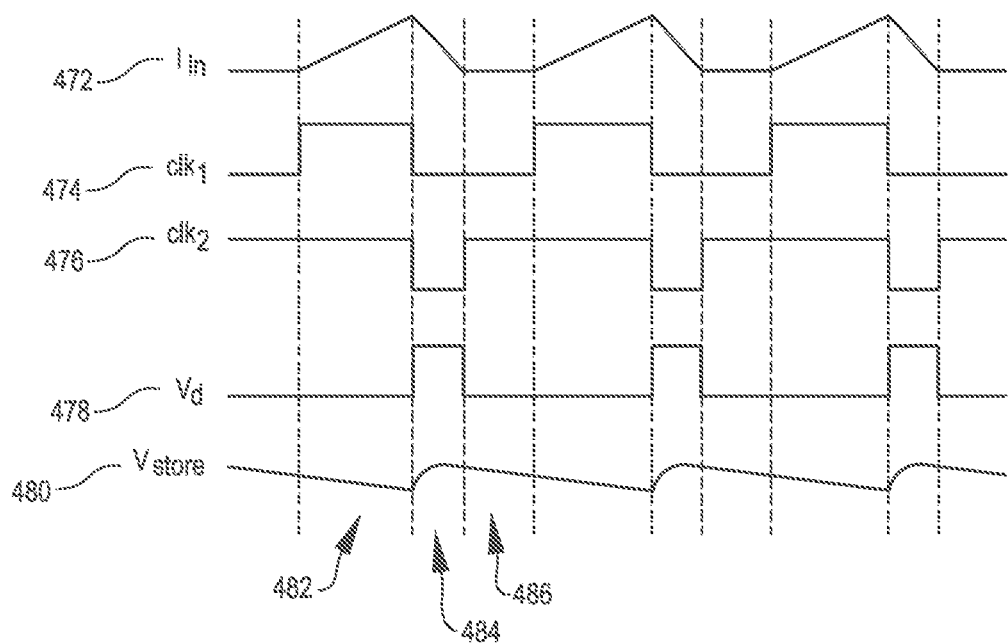

FIG. 4b shows a control signal timing chart for the thermoelectric harvesting system 400 shown in FIG. 4a. The current $I_{In}$ 472 is associated with the inductor 436a; the signals $CLK_1$ and $CLK_2$, 474, 476 are associated with the clock signal nodes $CLK_1$ 460a and $CLK_2$ 460b, respectively; the voltage $V_d$ 478 is associated with voltage at the $V_d$ node 434; and the voltage $V_{store}$ 480 is associated with the voltage at the $V_{store}$ node 442.

During a first cycle subset 482, $CLK_1$ signal node 474 is switched on while $CLK_2$ 476 is already on, (noting that the clock $CLK_2$ 460b closes the switch $M_2$ 438b when it has a null signal and opens the switch when it has a positive signal,) such that gate $M_1$ 438a is closed and gate $M_2$ 438b is open. During this subset, $V_d$ 478 is low; current $I_{In}$ 472 is increasing linearly; and the voltage $V_{store}$ 480 is returning from high to low from a previous cycle. During the second cycle subset 484, $CLK_1$ 474 and $CLK_2$ 476 are both switched off, causing gates $M_1$ 438a and $M_2$ 438b to become open and closed, respectively. During this cycle subset, the transient forcing effect of the inductor 436a causes the voltage $V_d$ 478 to remain high while the current $I_{In}$ 472 returns low; and the current is integrated into the energy storage element $C_{store}$ 444, raising $V_{store}$ 480. During the third cycle subset 486, $CLK_2$ 476 returns on, opening gate $M_2$ 438b.

The cycle 482, 484, 486 subsequently repeats, causing a series of voltage "spikes" in $V_d$ 478 that can be used to charge the energy storage element 444. However, in the conventional circuit 400, when voltage $V_{In}$ at the $V_{In}$ node 432 is negative, the current $I_{In}$ 472 generated in the inductor 436a flows in the opposite direction. Thus, in the negative polarity case, voltage $V_d$ at the $V_d$ node 448 is negative, thus leaching stored energy from the energy storage element $C_{store}$ 444.

Other variations are within the spirit of the present invention. Thus, while the invention is susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A thermoelectric generator comprising:
   a thermoelectric energy harvester;
   a switch matrix;
   a storage module; and
   a polarity monitor, wherein:
   the thermoelectric harvester has a first output and a second output having a voltage difference;
   the switch matrix is connected to the thermoelectric harvester and comprises a circuit that connects one of the first and second outputs to an input voltage node at the storage module;
   the storage module is connected to the switch matrix and comprises a converter for receiving the input voltage from the switch matrix and creating an amplified voltage from the input voltage; and
   the polarity monitor is connected to the storage module and to the switch matrix, and comprises:
   a polarity detection circuit for detecting a polarity of the amplified voltage; and
   a control circuit operable to, in response to detecting a reversed polarity, cause the switch matrix to switch which of the first and second outputs is connected to the input voltage node.

2. The thermoelectric generator of claim 1, wherein the switch matrix further comprises a first input, a second input, an output, and a ground; and wherein
   each of the first and second inputs is connected to the first output with respective intervening first and second switches;
   each of the first and second inputs is further connected with a ground by way of respective intervening third and fourth switches;
   the first and fourth switches are connected with a first control circuit;

the second and third switches are connected with a second control circuit; and the first and second control circuits are configured to be exclusively on/off or off/on such that, when the first control circuit is on, the first and fourth switches are open while the second and third switches are closed, connecting the first input to the output and the second input to ground; and when the first control circuit is off, the second and third switches are open and the first and fourth switches are closed, such that the second input is connected to the output and the first input is connected to ground.

3. The thermoelectric generator of claim 2, wherein the control circuit further comprises a control output and an inverter connected to the control output that generates an inverted control output, and wherein the control output and the inverted control output are connected, respectively, with the second and first control circuits of the switch matrix.

4. The thermoelectric generator of claim 1, wherein the polarity monitor further comprises a clocked comparator.

5. The thermoelectric generator of claim 1, wherein, the storage module further comprises a clocked, inductor-based boost converter that includes an inductor and a switching circuit, the switching circuit being operable to cause a charge-discharge sequence in the inductor for periodically generating an amplified voltage for charging and energy store, according to a clock-activated cycle.

6. The thermoelectric generator of claim 5, wherein the polarity monitor is configured to measure the polarity of the amplified voltage during a discharge sequence in the clock-activated cycle.

7. The thermoelectric generator of claim 5, wherein the polarity monitor further comprises a clocked comparator and a delay circuit connecting the clocked comparator to the storage module, such that the polarity monitor performs a comparison at a delay according to the clock-activated cycle.

8. The thermoelectric generator of claim 5, wherein the polarity monitor is configured to measure the polarity of the amplified voltage according to an evaluation cycle, the evaluation cycle being longer than the clock-activated cycle.

9. The thermoelectric generator of claim 8, further comprising an evaluation cycle control circuit operable to close a switch between the amplified voltage and the energy store during the evaluation cycle.

10. The thermoelectric generator of claim 1, wherein each of the switch matrix, storage module, and polarity monitor are digital.

11. The thermoelectric generator of claim 1, wherein each of the switch matrix, storage module, and polarity monitor are integrated on one or more chips.

* * * * *